United States Patent
Jackson

(10) Patent No.: US 7,291,564 B1
(45) Date of Patent: Nov. 6, 2007

(54) METHOD AND STRUCTURE FOR FACILITATING ETCHING

(75) Inventor: Warren Jackson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 60 days.

(21) Appl. No.: 11/414,411

(22) Filed: Apr. 28, 2006

(51) Int. Cl.
*H01L 21/461* (2006.01)
*H01L 21/302* (2006.01)

(52) U.S. Cl. .................. 438/706; 438/707; 438/714

(58) Field of Classification Search .................. None
See application file for complete search history.

(56) References Cited

U.S. PATENT DOCUMENTS

| | | | |
|---|---|---|---|
| 6,258,497 B1 * | 7/2001 | Kropp et al. | 430/30 |
| 6,642,090 B1 * | 11/2003 | Fried et al. | 438/164 |
| 2002/0149109 A1 * | 10/2002 | Watanabe | 257/758 |
| 2006/0003540 A1 * | 1/2006 | Van Haren et al. | 438/424 |

* cited by examiner

*Primary Examiner*—Duy-Vu N Deo

(57) ABSTRACT

A method and system for facilitating etching. Specifically, the method includes incorporating a fluorescent marker in a layer of a grouping of patterned layers. Etching of the group of patterned layers is controlled based upon the fluorescent marker.

20 Claims, 11 Drawing Sheets

METHOD AND STRUCTURE FOR FACILITATING ETCHING

CROSS REFERENCE TO RELATED APPLICATIONS

This application is related to U.S. Pat. No. 6,887,792, entitled "EMBOSSED MASK LITHOGRAPHY," filed Sep. 17, 2002, and assigned to the assignee of the present invention, the disclosure of which is hereby incorporated herein by reference. This application is also related to U.S. Pat. No. 6,861,365, entitled "METHOD AND SYSTEM FOR FORMING A SEMICONDUCTOR DEVICE," filed Jun. 28, 2002, and assigned to the assignee of the present invention, the disclosure of which is hereby incorporated herein by reference.

BACKGROUND ART

There is currently a strong trend toward downsizing existing structures and fabricating smaller structures. This process is commonly referred to as microfabrication. One area in which microfabrication has had a sizeable impact is in the microelectronic area. In particular, the downsizing of microelectronic structures has generally allowed the structures to be less expensive, have higher performance, exhibit reduced power consumption, and contain more components for a given dimension. Although microfabrication has been widely active in the electronics industry, it has also been applied to other applications such as biotechnology, optics, mechanical systems, sensing devices, and reactors.

One method employed in the microfabrication process is imprint lithography as an alternative to photolithography techniques. Imprint lithography is typically utilized to pattern thin films on a substrate material with high resolution. The thin films patterned can be dielectrics, semiconductors, metals or organics and can be patterned as thin films or individual layers. Imprint lithography is particularly useful for patterning devices in a roll-to roll environment since imprint lithography is not as sensitive to planarity as photolithography. Additionally, imprint lithography has a higher throughput, can handle wider substrates and does not require step and repeat processing.

Previous methods of layer thickness measurements during etching used in typical photolithography techniques include optical interference, optical reflectivity, residual gas analysis (RGA), and ultrasound. In typical photolithography, most etching steps are terminated by using the large differential etch rates between various materials so careful control of etch rates and depths is often not required. However, these previous methods typically have difficulty measuring thin layers (e.g., less than 100 nm) which occur commonly as residual layer thicknesses.

In the case of imprint lithography, the etch rate can depend on the lateral shape of the layer and is uniform across the sample. These factors preclude the use of special test structures. Also, because the various layer thicknesses are laterally close to each other for most structures, it is desirable that the thickness measurement have high lateral spatial resolution for the various levels. The multilevel nature of imprint lithography etching also makes the use of RGA to detect lay removal for endpoint detection rather difficult because the different layer thicknesses contribute to the signal. Moreover, in the case of roll-to-roll processing, the typical endpoint detection is inadequate because the sample has all thicknesses present at the same time in steady state. Hence, the onset of a new signal indicating etching of a new layer is much less pronounced.

Accordingly, what is needed is a manner of remote real time layer thickness monitoring for etching.

BRIEF DESCRIPTION OF THE DRAWINGS

The above and other objects and advantages of the present invention will be more readily appreciated from the following detailed description when read in conjunction with the accompanying drawings.

DETAILED DESCRIPTION OF THE INVENTION

Figure 1:
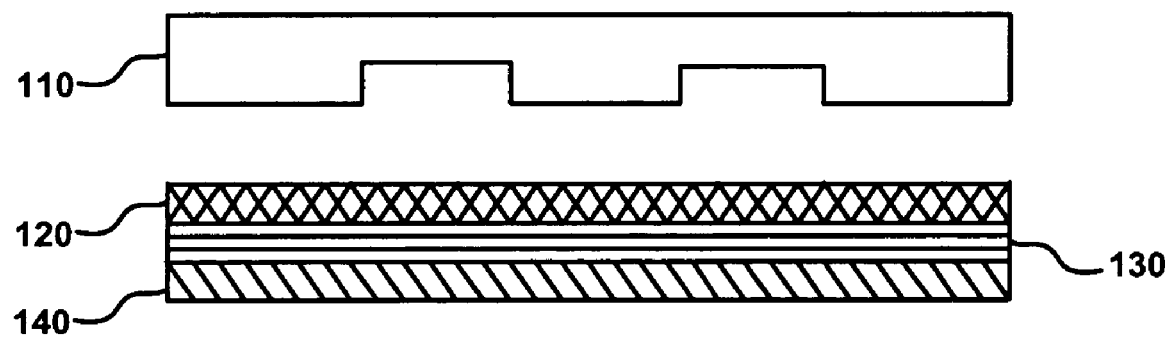
FIG. 1 shows an exemplary grouping of patterned layers just prior to the commencement of embossed mask lithography, in accordance with one embodiment of the present invention.

Reference will now be made in detail to embodiments of the present invention, a method and system for etching of patterned layers, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, various embodiments of the present invention disclose a method and system for etching of patterned layers. Embodiments of the present invention provide for the above accomplishments and provide for the controlled removal of various layers of imprint material and deposited device layers. In addition, other embodiments provide the above accomplishments and further provide for remote, real-time monitoring and measuring of layer thicknesses. Still other embodiments provide the above accomplishments and further provide for a method and structures facilitating precise etch control and layer thickness estimates using non-contact remote sensing optical methods.

Self Aligned Imprint Lithography

In at least one embodiment, the method for controlling etching is employed in a Self-Aligned Imprint Lithography ("SAIL") process for producing multilayer patterns on flexible substrates in order to produce semiconductor devices. The basics of this process are set forth and described in U.S. Pat. No. 6,861,365 and U.S. Pat. No. 6,887,792, the disclosures of which is incorporated herein by reference. It shall also be realized that the present methods and structures for facilitating etching of the present invention may also be employed upon other lithography techniques, such as photolithography techniques, in accordance with other embodiments of the present invention.

The SAIL technique uses a three-dimensional (3D) patterned resist and is typically employed in roll-to-roll processing. As the 3D resist is flexible, the pattern will stretch or distort to the same degree as the substrate. As such, a SAIL roll-to-roll fabrication process may be employed to provide low cost manufacturing solutions for devices suitable for roll-to-roll processing.

Utilizing height differences in an imprinted 3D stamp or other provided 3D structure, multi-level pattern information is provided and self alignment maintained independent of the instability of a flexible substrate. It shall also be realized that the disclosed method may be employed upon a non-flexible substrate while remaining within the spirit and scope of at least one embodiment of the present invention.

FIG. 1 is a diagram of a cross section of a grouping of patterned layers shown just prior to the commencement of embossed mask lithography, or imprint lithography, in accordance with one embodiment of the present invention. In particular, embodiments of the present invention form semiconductor devices from the combination of at least a grouping of patterned layers.

The grouping of patterned layers as shown in FIG. 1 comprises a substrate 140. In one embodiment, the substrate 140 comprises a flexible substrate adequate for use in a roll-to-roll fabrication process. The substrate 140 may be formed from a variety of commercially available flexible substrates (such as polymer materials or other flexible materials), all of which are preferably in the form of a sheet material. The substrate is preferably thin to permit flexible "roll-to-roll" processing, such as of the order of 0.01 mm to 0.05 mm in thickness.

The present embodiment utilizes a flexible polymer substrate because the materials can be produced and processed at relatively low cost. However, it is not essential that a polymer (plastic) material be used as a substrate, and other embodiments of the present invention provide for substrates made from more rigid materials, such as those used in conjunction with more traditional lithography techniques, such as photolithography.

The grouping of patterned layers may comprise at least one thin film 130 for patterning, in one embodiment. The thin film as shown in FIG. 1 is formed on substrate 140. The thin film depositions for thin film 130 may comprise one or more layers of metals, semiconductors and dielectrics. There are many different materials that may be used for the semiconductor layer of the memory circuits, such as organic and inorganic materials, with inorganic semiconductor materials being preferred, because of their environmental stability and maturity of technology. Of course, other materials may also be employed for the purposes of the present invention, as will be apparent to those skilled in the art.

Applied on top of thin film 130 is embossing layer 120. The embossing layer 120 may be an uncured layer of UV curable resin, or a softened thermoplastic resin, or a chemically softened plastic, or other liquid based materials and solids applied at high temperatures. In one preferred embodiment, embossing layer 120 comprises a photopolymer, such as a UV curable resin coated on thin film 130.

Figure 2:
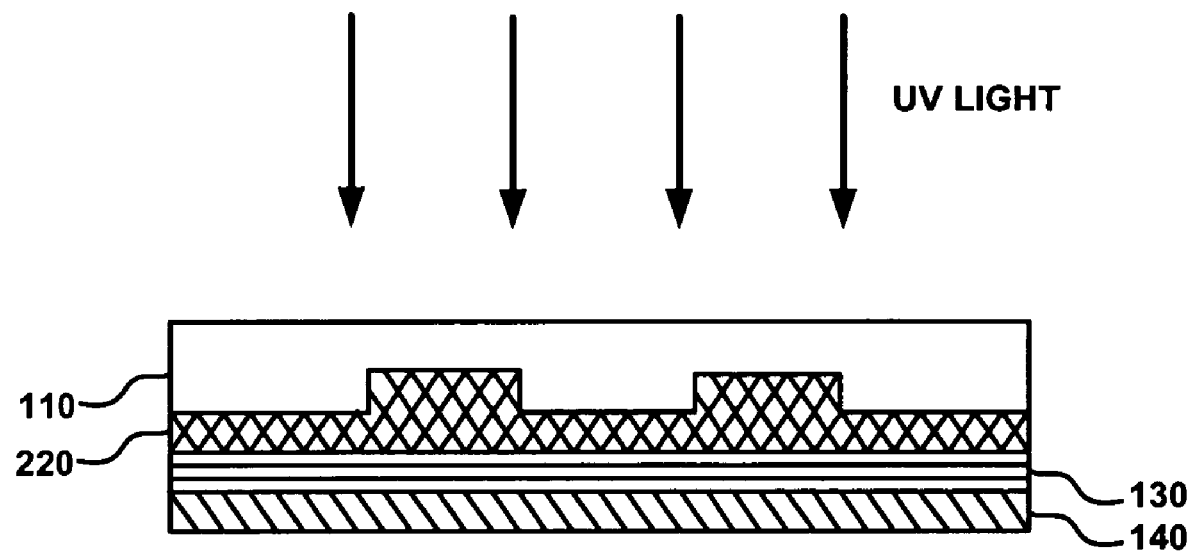
FIG. 2 is a diagram illustrating how a 3-dimensional (3D) resist structure 220 is formed within the embossing layer 120, in accordance with one embodiment of the present invention.

FIG. 2 is a diagram illustrating how a 3-dimensional (3D) resist structure 220 is formed within the embossing layer 120, in accordance with one embodiment of the present invention. The 3D resist structure is formed over the thin film 130 layer of material, wherein the 3D resist structure 220 comprises a plurality of different vertical heights throughout the structure. Since the 3D resist structure 220 comprises a plurality of different vertical heights throughout the structure, the 3D resist structure 220 can be utilized to transfer alignment patterns to an underlying layer (e.g., thin film layer 130) based on subsequent etching steps.

For example, the embossing layer 120 is embossed with a pattern of micron or sub-micron scale features. The embossing is performed by a stamper or embossing tool 110 which is part of a roll (not depicted) or the top surface of a flat stamper, which has features, defined on its surface. That is, the 3D resist structure is generated by utilizing the stamping tool 110. In its softened, liquid state, very little of the undesirable deforming pressure is exhibited on the substrate 140 and thin film layers 130 when embossing layer 120 is embossed by the embossing tool 110 in a roll-to-roll process.

Typically, the embossing tool 110 is fixed to one roller that is held a fixed distance from a second roller. The coated substrate is fed between the rollers with the softened plastic being impressed with the topological features of the embossing tool as the web passes through the nib between the rollers. The stamper or embossing tool 110 may be formed from a UV transparent material such as PDMS (poly dimethyl siloxane).

Provision of embossing tool 110 as a transparent structure means that the embossing layer 120, instead of just being generally exposed to a curing light energy, is embossed and then precisely exposed according to the pattern through the transparency of the embossing tool 110, in accordance with one embodiment of the present invention. Preferably, such curing will occur while the embossing tool 110 is fully engaged with the embossing layer 120 so as to minimize the precision of the exposure and so as to permit the embossing tool 110 to cleanly withdraw from the embossed embossing layer 120. In one embodiment, the light energy will be a UV light source which is directed substantially from behind the embossing tool as pictured in FIG. 2. As such, the embossed embossing layer 120 can be cured precisely in order to form the desired topography, and so as to permit the embossing tool 110 to cleanly withdraw from the embossed embossing layer 120.

Fluorescent Markers Facilitating Etching

Figure 5:
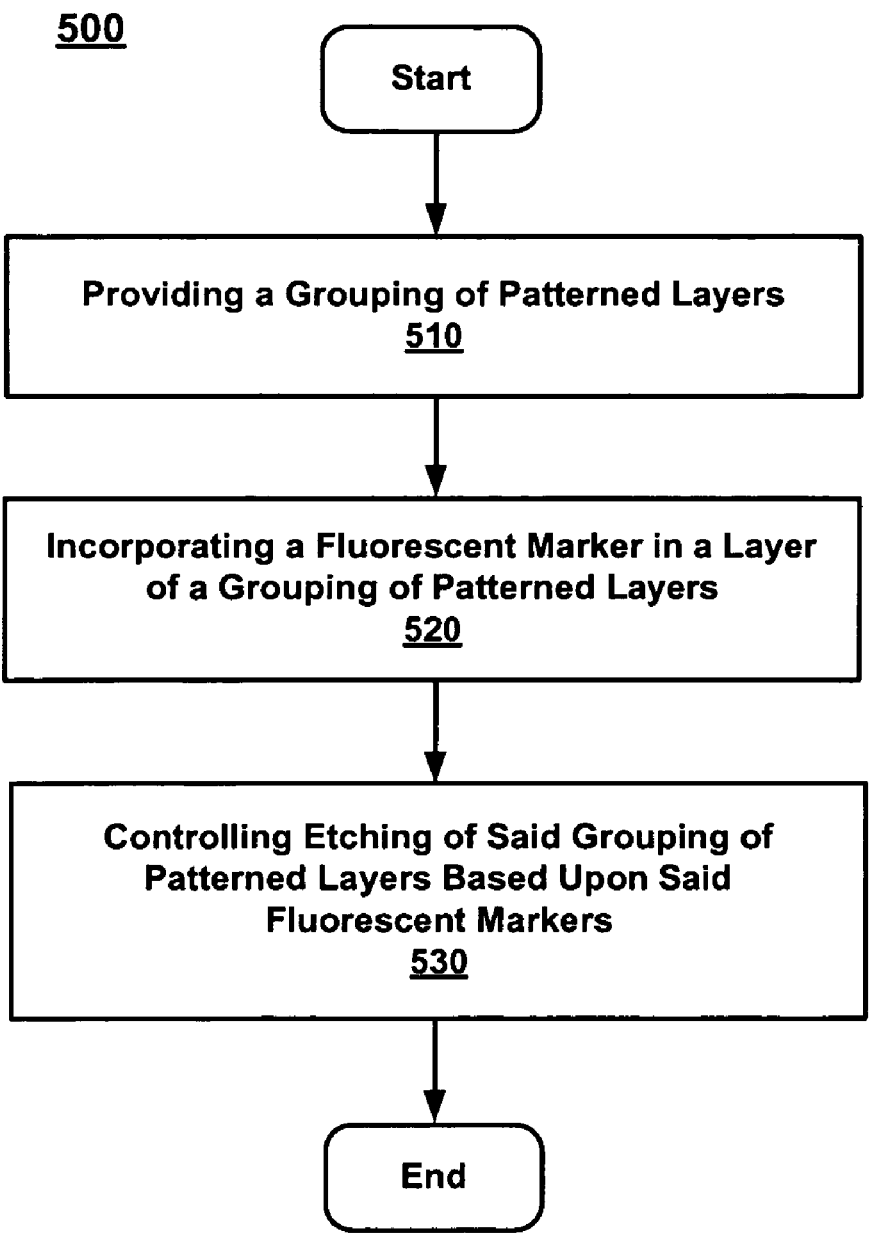
FIG. 5 is a flow diagram illustrating a method for facilitating etching in a semiconductor manufacturing process, in accordance with one embodiment of the present invention.

FIG. 5 is a flow diagram 500 illustrating operations in a method for facilitating etching, in accordance with one embodiment of the present invention. The present embodiment is able to provide precise etch control and layer thickness estimates using non-contact remote sensing optical tools. While the present embodiment is implemented within a process of microstructure fabrication using imprint lithography for roll-to-roll processing, other embodiments are well suited to implementation of the method of FIG. 5 within traditional etching processes as well. Additionally, the method of FIG. 5 is equally adaptable for the fabrication of micro-electro-mechanical structures (MEMs), in another embodiment.

At 510, the present embodiment provides a grouping of patterned layers. The grouping of patterned layers comprises a substrate and at least one other layer. In one embodiment, the layer comprises a device layer, and in another embodiment, the layer comprises an embossing layer from which a 3D resist structure is created. For example, in another embodiment, FIG. 1 shows an exemplary grouping of patterned layers and comprises a substrate, a device layer, and an embossing layer from which a 3D resist structure is created.

At 520, the present embodiment incorporates a fluorescent marker in a layer of a grouping of patterned layers. In one embodiment, the fluorescent marker comprises a phosphor. In one embodiment, the phosphor is within the spectrum of visible light. In another embodiment, the phosphor is outside the spectrum of visible light.

For instance, the fluorescent marker is incorporated in the embossing layer, or the imprinted polymer, in accordance with one embodiment. That is, the resulting 3D resist structure comprises the fluorescent marker. For example, in accordance with embodiments of the present invention typical fluorescent markers incorporated within the 3D resist structure include but are not limited to rhodamin 6G, Alexa Fluor 488Dye, Fluorescein, Oregon green (Molecular Proble), etc.

In another embodiment, the fluorescent marker is incorporated within the device layer. Fluorescent markers appropriate for incorporation into the device layer include but are not limited to rare earth ions. These rare earth ions can be introduced during deposition by sputtering, or through organometalic rare earth compounds.

In still another embodiment, the fluorescent maker is incorporated as an additive to traditional photoresist. The fluorescent marker is used to provide for the elimination of photoresist residue, or when undercutting of structures during lift off is controlled.

At 530, the present embodiment controls etching of the grouping of patterned layers based upon the fluorescent marker. That is, the fluorescent marker is used to control etching of the layer in which the fluorescent marker is incorporated. For instance, in one embodiment etching is controlled based upon the intensity of emitted energy produced by the fluorescent marker in the layer. In particular, the fluorescence light emitted and measured from the layer that is illuminated by excitation light is proportional to the thickness of the layer incorporating the fluorescent marker. Measurement of the intensity of the emitted fluorescence light is accomplished with an appropriate imaging system.

As a result, based upon the feedback provided by the fluorescent marker, etch rates of the grouping of patterned layers can be adjusted. In particular, based upon the intensity of the fluorescence light emitted from the layer that is measured, etch rates of the layer within which the fluorescent marker is incorporated can be adjusted.

For example, if the reflective energy is too high with respect to a threshold value, this indicates that etching of the layer has not been completed to a predetermined point. As such, the etching of the layer is increased so that more of the layer is etched away.

On the other hand, if the reflective energy is too low with respect to a threshold value, this indicates that too much of the layer has been etched. As such, etching of the layer is decreased so that less of the layer is etched away.

FIGS. 3A-D are illustrations of a grouping of patterned layers undergoing various stages of etching, wherein the etching is precisely controlled through implementation of embodiments of the present invention. That is, fluorescent markers incorporated within the layers in the grouping of patterned layers are used for controlling the etching of the grouping of patterned layers.

Figure 3A:
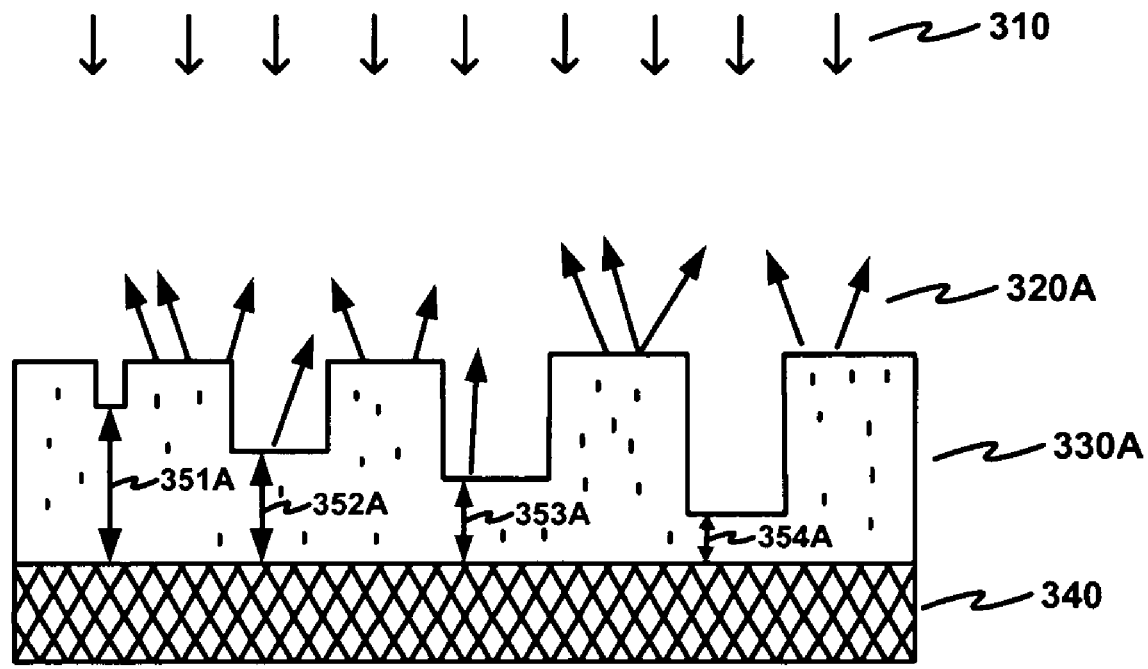
FIG. 3A is a cross section of a grouping of patterned layers with a 3D resist layer that incorporates a fluorescent marker, in accordance with one embodiment of the present invention.

In particular, FIG. 3A is a cross section of a grouping of patterned layers 300A including a fluorescent marker for facilitating etching, in accordance with one embodiment of the present invention. The grouping of patterned layers comprises a substrate 340 and a 3D resist structure 330A deposited over the substrate 340. That is, a substrate is provided, and a 3D resist structure 330a is deposited over the substrate. The 3D resist layer 330A incorporates a fluorescent marker, in accordance with one embodiment of the present invention.

As can be seen in FIG. 3A, the formed 3D resist structure 330A comprises several different vertical heights 351A, 352A, 353A, and 354A. Preferably, the vertical heights are discretely different, such that one height is substantially different from another height. Accordingly, these different vertical heights allow the 3D resist structure to be utilized to transfer alignment patterns to underlying layers based on subsequent etching steps.

The fluorescent marker is used for controlling etching of the 3D resist structure 330. Specifically, the fluorescent marker is responsive to excitation energy 310 of a first frequency. That is, the fluorescent marker in the 3D resist structure 330A will fluoresce when the excitation energy 310 illuminates the 3D resist structure. The fluorescent light emitted 320A from the 3D resist structure 330A is proportional to the thickness of the layer 330A. As such, the present embodiment is able to measure the emitted energy of the fluorescent marker in the 3D resist structure 330A to determine a degree of etching of the 3D resist structure.

In one embodiment, measurement of the intensity of the emitted fluorescent light 320A is taken across a large area of the 3D resist structure 330A that encompasses many of the submicron relief structures present in the 3D resist structure 330A. In another embodiment, measurement of the intensity of the emitted fluorescent light 320A is concentrated to a specific area of the 3D resist structure 330A. For example, the measurement may be confined to a peak or valley of the resist structure 330A.

In some cases, with a reflective underlayer (e.g., substrate) interference fringes may complicate the relationship between fluorescence and film thickness. In order to minimize this error, the fluorescent marker can be illuminated from different directions. This can be accomplished using various methods. In one embodiment, to reduce the effects of interference fringes, the source of the excitation energy 310 is arranged or configured such that the excitation energy 310 illuminates the 3D resist structure 330A over a plurality of incident angles. That is, the excitation energy 310 is directed at the surface of the 3D resist structure 330A over many angles. In another embodiment, to reduce the effects of interference fringes, the excitation energy 310 comprises a plurality of wavelengths. That is, light energy of varying wavelengths illuminates the 3D resist structure 330. In still another embodiment, to reduce the effects of interference fringes, the surface of the 3D resist structure that is exposed to the excitation energy 310 is textured. Although each of the embodiments above are described in relation to FIG. 3A, these embodiments are equally applicable for implementation in FIGS. 3B, 3C, 3D, 4A, and 4B in other embodiments of the present invention.

Figure 3B:
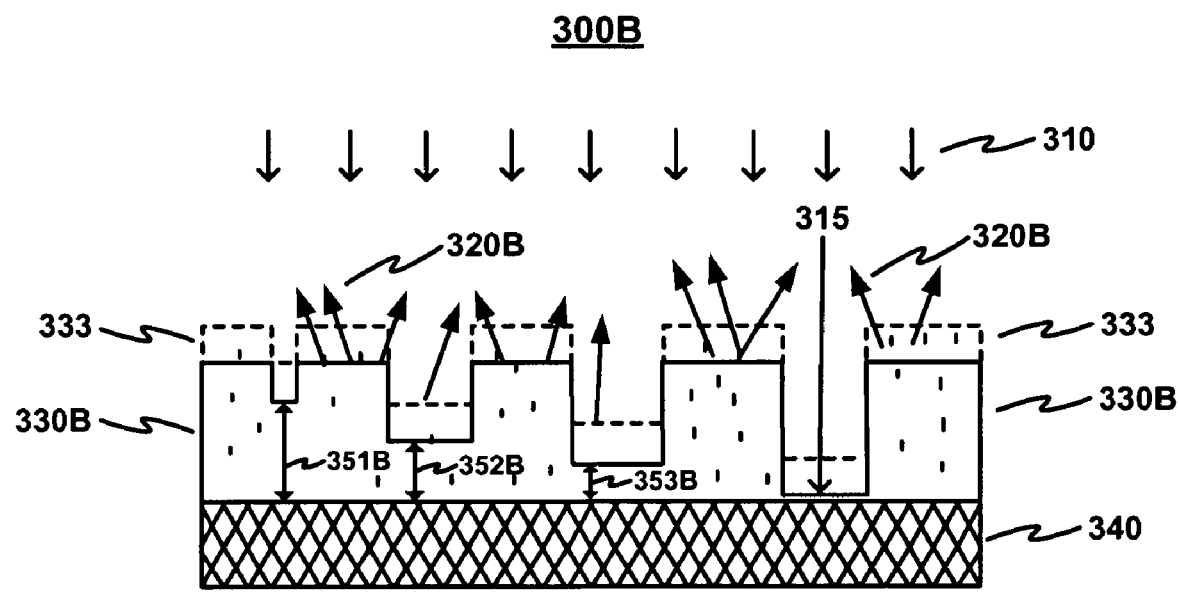
FIG. 3B is a cross section of the grouping of patterned layers of FIG. 3A with a first stage of etching performed, in accordance with one embodiment of the present invention.

FIG. 3B is a cross section of the grouping of patterned layers of FIG. 3A with a first stage of etching performed, in accordance with one embodiment of the present invention. In particular, the thinnest layer of the resist structure is removed exposing a portion 315 of the substrate 340. The resist layer is removed in an anisotropic etch process, in one embodiment. For instance, the thickness 354A is reduced to zero, thereby exposing the portion 315 of the substrate 340.

As shown in FIG. 3B, the dotted areas illustrate areas 333 that have been etched away. In addition, the vertical heights of FIG. 3A have been reduced. That is, vertical heights 351B, 352B, and 353B are reduced from corresponding vertical heights 351A, 352A, and 353A.

In particular, the emitted light energy 320B responsive to excitation energy 310 has less intensity than the emitted light energy 320A of FIG. 3A. This is because, the intensity of the fluorescent marker incorporated into the 3D resist structure is proportional to the thickness of the 3D resist structure. As such, in one embodiment, the intensity from emitted light 320B from the 3D resist structure 330B is less than the intensity of emitted light 320A from the 3D resist structure 330A.

More specifically, the intensity of the light energy surrounding portion 315 of FIG. 3B can be measured with accuracy. Since the 3D resist structure 330B at portion 315 has been etched away, the emitted light energy from the fluorescent marker should be minimal, or close to zero, which forms a desired threshold. As such, upon inspection, the present embodiment can determine if the 3D resist structure has been etched away sufficiently to expose portion 315. That is, if there is still emitted energy 320B from portion 315, which is greater than the desired threshold, then the 3D resist structure 330A and 330B needs more etching. On the other hand, if there is no emitted energy 320B from portion 315, which meets the desired threshold, then the 3D resist structure 330B has been etched enough to expose portion 315.

Intermediate fabrication steps may be included between each of the FIGS. 3A-3D, but for purposes of clarity and brevity are not described. For instance, further masking, deposition, and implantation steps may be included to further define and fabricate the finished plurality of semiconductor structures. As an example, after FIG. 3B, etching is performed to create pockets within the substrate 340 at the exposed portion 315.

Figure 3C:
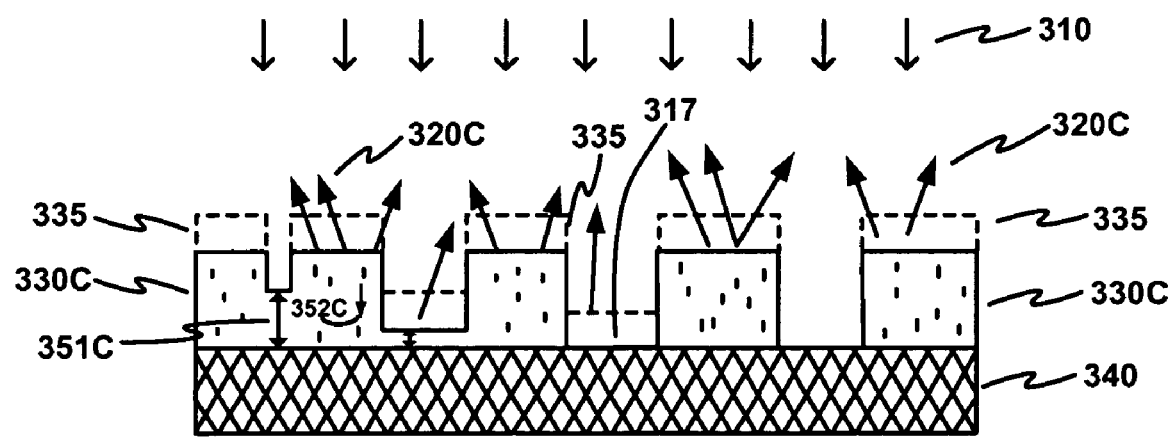
FIG. 3C is a cross section of the grouping of patterned layers of FIG. 3A with a second stage of etching performed, in accordance with one embodiment of the present invention.

FIG. 3C is a cross section of the grouping of patterned layers of FIG. 3A with a second stage of etching performed, in accordance with one embodiment of the present invention. In particular, the next thinnest layer of the 3D resist structure is removed thereby exposing a portion 317 of the substrate 340. The resist layer is removed in an anisotropic etch process, in one embodiment. For instance, the thickness 353B is reduced to zero, thereby exposing the portion 317 of the substrate 340.

As shown in FIG. 3C, the dotted areas illustrate areas 335 that have been etched away. In addition, the vertical heights of FIG. 3B have been reduced. That is, vertical heights 351C, 352C, and 353C are reduced from corresponding vertical heights 351B, 352B, and 353B.

In particular, the emitted light energy 320C responsive to excitation energy 310 has less intensity than the emitted light energy 320B of FIG. 3B. More specifically, the intensity of the light energy surrounding portion 317 of FIG. 3C can be measured with accuracy. Since the 3D resist structure 330C at portion 317 has been etched away, the emitted light energy from the fluorescent marker should be minimal, or close to zero. As such, upon inspection, the present embodiment can determine if the 3D resist structure has been etched away sufficiently to expose portion 317. That is, if there is still emitted energy 320C from portion 317, then the 3D resist structure 330B and 330C needs more etching. On the other hand, if there is no emitted energy 320C from portion 317, then the 3D resist structure 330C has been etched enough to expose portion 317.

Figure 3D:
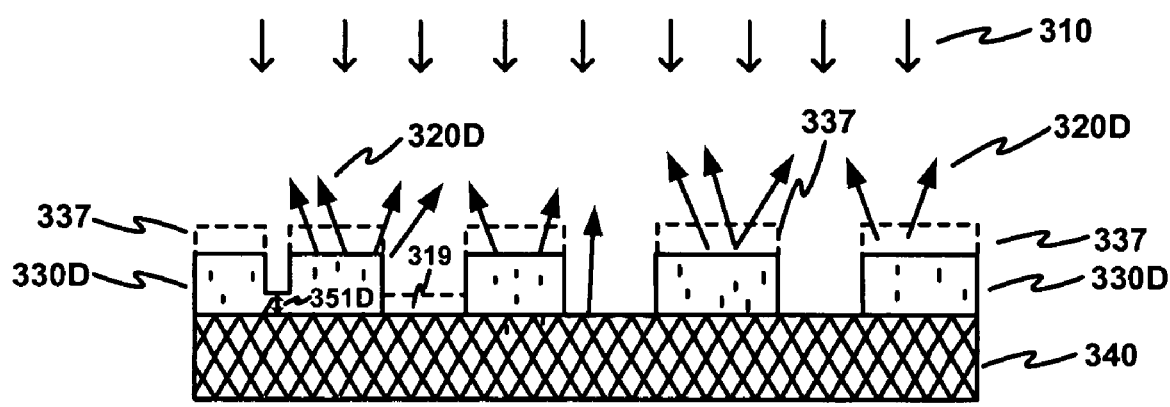
FIG. 3D is a cross section of the grouping of patterned layers of FIG. 3A with a third stage of etching performed, in accordance with one embodiment of the present invention.

FIG. 3D is a cross section of the grouping of patterned layers of FIG. 3A with a second stage of etching performed, in accordance with one embodiment of the present invention. In particular, the next thinnest layer of the 3D resist structure is removed thereby exposing a portion 319 of the substrate 340. The resist layer is removed in an anisotropic etch process, in one embodiment. For instance, the thickness 352C has been reduced to zero, thereby exposing the portion 319 of the substrate 340.

As shown in FIG. 3D, the dotted areas illustrate areas 337 that have been etched away. In addition, the vertical heights of FIG. 3C have been reduced. That is, vertical height 351D has been reduced from corresponding vertical heights 351C.

In particular, the emitted light energy 320D responsive to excitation energy 310 has less intensity than the emitted light energy 320C of FIG. 3C. More specifically, the intensity of the light energy surrounding portion 319 of FIG. 3D can be measured with accuracy. Since the 3D resist structure 330D at portion 319 has been etched away, the emitted light energy from the fluorescent marker should be minimal, or close to zero. As such, upon inspection, the present embodiment can determine if the 3D resist structure has been etched away sufficiently to expose portion 319. That is, if there is still emitted energy 320D from portion 319, then the 3D resist structure 330C needs more etching. On the other hand, if there is no emitted energy 320D from portion 319, then the 3D resist structure 330D has been etched enough to expose portion 319.

Figure 4A:
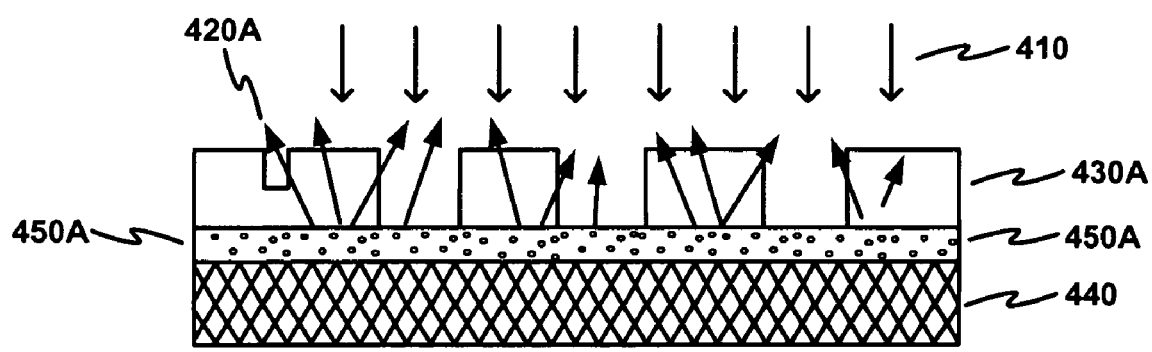
FIG. 4A is a cross section of a grouping of patterned layers with a device layer that incorporates a fluorescent marker, in accordance with one embodiment of the present invention.
Figure 4B:
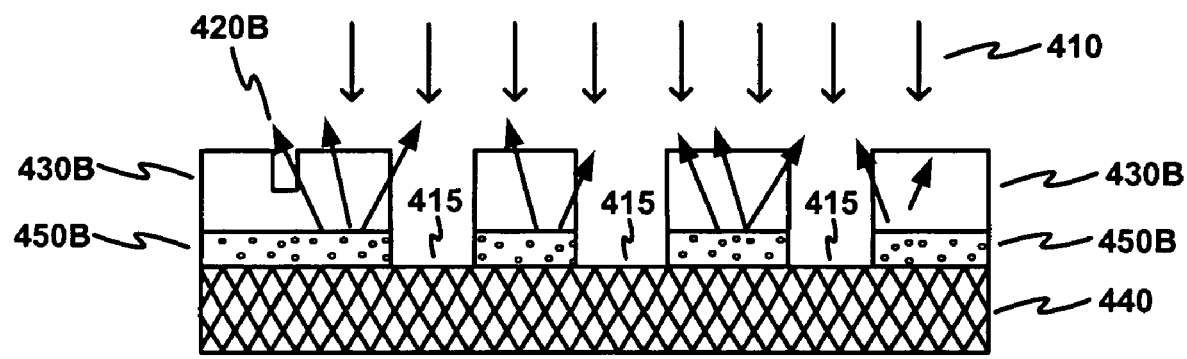
FIG. 4B is a cross section of the grouping of patterned layers of FIG. 4a with a stage of etching performed, in accordance with one embodiment of the present invention.

FIGS. 4A and 4B are illustrations of a grouping of patterned layers undergoing various stages of etching, wherein the etching is precisely controlled through implementation of embodiments of the present invention. That is, fluorescent markers incorporated within the layers in the grouping of patterned layers are used for controlling the etching of the grouping of patterned layers.

In particular, FIG. 4A is a cross section of a grouping of patterned layers 400A including a fluorescent marker for facilitating etching, in accordance with one embodiment of the present invention. The grouping of patterned layers comprises a substrate 440, a device layer 450A, and a 3D resist structure 430A deposited over the device layer 450A. In one embodiment, the device layer 450A comprises multiple layers and is sandwiched between the substrate 440 and the 3D resist structure 430A. In particular, the device layer 450A incorporates a fluorescent marker, in accordance with one embodiment of the present invention. As shown in FIG. 4A, portions of the device layer 450A are exposed.

The fluorescent marker is used for controlling etching of the device layer 450A. Specifically, the fluorescent marker is responsive to excitation energy 410 of a first frequency. That is, the fluorescent marker in the device layer 450A will fluoresce when the excitation energy 410 illuminates the device layer 450A. The fluorescent light emitted 420A from the device layer 450A is proportional to the thickness of the layer. As such, the present embodiment is able to measure the emitted energy of the fluorescent marker in the device layer 450A to determine a degree of etching of the device layer 450A.

In one embodiment, measurement of the intensity of the emitted fluorescent light 420A is taken across a large area of the device layer 450A. In another embodiment, measurement of the intensity of the emitted fluorescent light 320A is concentrated to a specific area of the device layer 450A. For example, the measurement may be concentrated to a portion of the device layer 450A that is exposed.

FIG. 4B is a cross section of the grouping of patterned layers of FIG. 4A with a first stage of etching performed, in accordance with one embodiment of the present invention. As shown in FIG. 4B, only the exposed areas of the device layer 450A of FIG. 4A have been etched. As a result, the etching performed resulting in FIG. 4B exposes portions 415 of the substrate 440.

In particular, the emitted light energy 420B from the device layer 450B responsive to excitation energy 410 has less intensity than the emitted light energy 420A of FIG. 4A. This is because, the intensity of the fluorescent marker incorporated into the device layer is proportional to the thickness of the 3D resist structure. As such, in one embodiment, the intensity from emitted light 420B from the device layer 450B is less than the intensity of emitted light 420A from the device layer 450A.

More specifically, the intensity of the light energy surrounding portion 415 of FIG. 4B can be measured with accuracy. Since the device layer 450B at portion 415 has been etched away, the emitted light energy from the fluorescent marker should be minimal, or close to zero, which is a desired threshold. As such, upon inspection, the present embodiment can determine if the device layer has been etched away sufficiently to expose portion 415. That is, if there is still emitted energy 420B from portion 415, which is above the desired threshold, then the device layer 450B that is exposed needs more etching. On the other hand, if there is no emitted energy 420B from portion 415, which meets the desired threshold, then the device layer 450B has been etched enough to expose portion 415.

In one embodiment, the 3D resist structure 430A incorporates a second fluorescent marker for controlling etching of the 3D resist structure 430A, wherein said second fluorescent marker is responsive to light energy at a second frequency. In particular, etching of the 3D resist structure 430A is similar to the etching of the 3D resist structure 330A of FIG. 3A. As such, the grouping of patterned layers 400A is responsive to two different excitation light energies of two different frequencies. As a result, the etching of the two different layers can be precisely controlled by individually using the corresponding excitation light energy for a particular layer.

Figure 6:
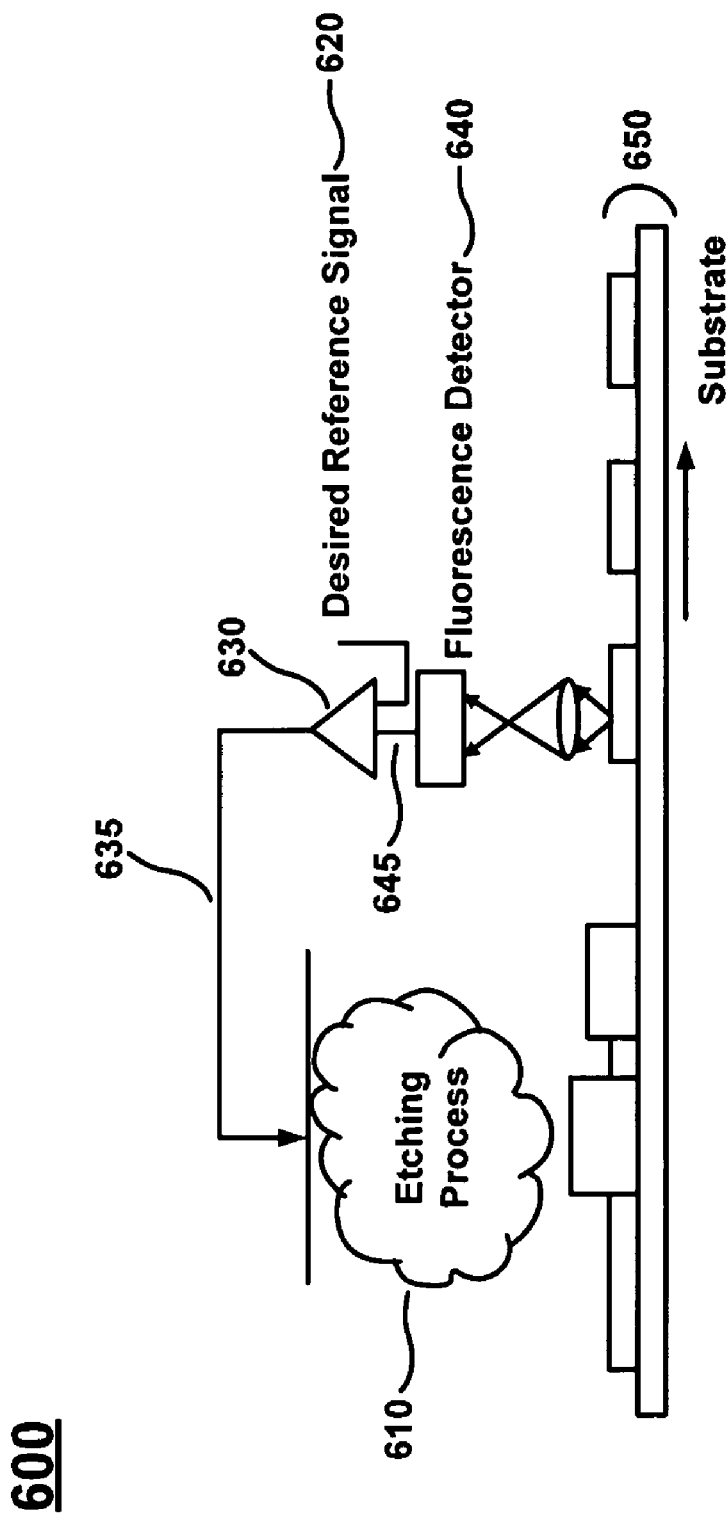
FIG. 6 is an illustration showing a feedback system implementing the use of fluorescent markers for monitoring etch processes in a roll-to-roll system, in accordance with one embodiment of the present invention.

FIG. 6 is an illustration showing a feedback system 600 implementing the use of fluorescent markers for monitoring etch processes in a roll-to-roll system, in accordance with one embodiment of the present invention. As shown in FIG. 6, the grouping of imprinted patterned layers 650 flows from right to left through the feedback system 600. In the case of the roll-to-roll system of FIG. 6, the monitoring occurs downstream from the processing or etching processes. As such, feedback results can be applied to subsequent groupings of patterned layers that are identical to the grouping of patterned layers under examination. As a result, the use of fluorescent markers in the etch process ensures that process variations are minimized.

As shown in FIG. 6, the etching process 610 is performed on the roll-to-roll system. The feedback system 600 is able to determine if changes to the etching process are needed at the etching process 610.

Simultaneously, the present system 600 is able to examine the etching process in a downstream grouping of patterned layers that already has undergone the etching process. That is, previously, in the roll-to-roll system, the etching process has already been performed on an identical grouping of patterned layers.

The feedback system includes a fluorescence detector 640 that measures the intensity of the fluorescence of the fluorescent markers in the grouping of patterned layers under test. The fluorescence detector 640 can be any appropriate imaging system (e.g., a photodiode, fluorescent microscope, etc.). In one embodiment, the fluorescent detector 640 produces a signal 645 that is compared to a desired reference signal 620 (e.g., a threshold signal) by the comparator 630. The desired reference signal 620 indicates the minimum acceptable amount of etching to be performed. In another embodiment, the signal 645 can be processed visually, and a determination can be made if less or more etching is desired.

Depending on the results of the comparator 630, a feedback signal 635 is returned to the etching process. For example, if the signal 645 is more intense than the desired reference signal 620, then more etching is desired. On the other hand, if the signal 645 is less intense than the desired reference signal 620, then less etching is desired.

Figure 7:
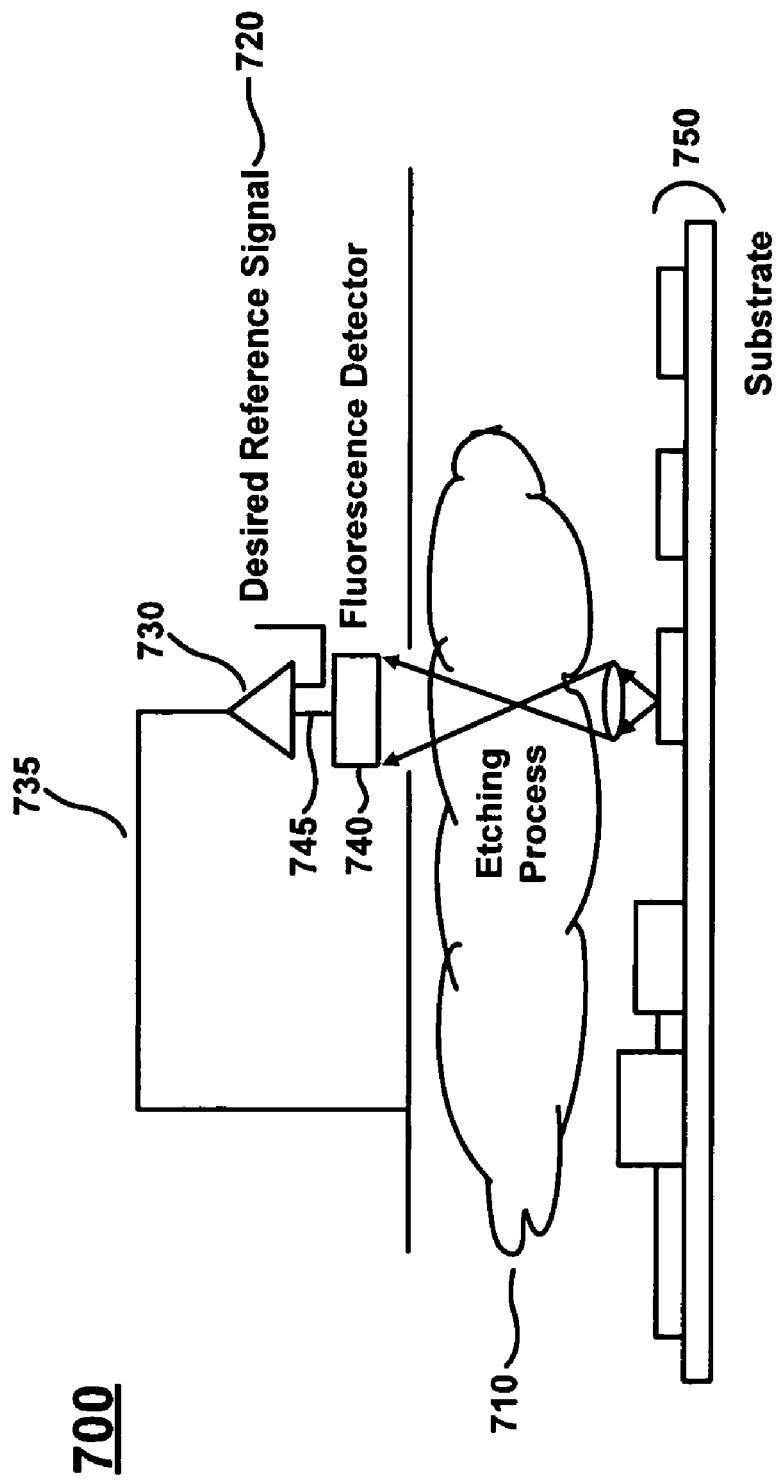
FIG. 7 is an illustration showing a feedback system implementing the use of fluorescent markers for monitoring etch processes in a traditional etching process, in accordance with one embodiment of the present invention.

FIG. 7 is an illustration showing a feedback system 700 implementing the use of fluorescent markers for monitoring etch processes in a traditional etching process, in accordance with one embodiment of the present invention. For example, the etching and monitoring processes spatially coincide. That is, feedback provided by the feedback system 700 is implemented directly upon the structure under test.

As shown in FIG. 7, the grouping of imprinted patterned layers 750 is present within the feedback system 700. In the present embodiment, the monitoring occurs concurrently with the etching processes. As such, feedback results can be applied to present groupings of patterned layers under test. As such, the use of fluorescent markers in the etch process ensures that process variations are minimized.

As shown in FIG. 7, an etching process 710 is performed. The feedback system 700 is able to determine if changes to the etching process are needed during the etching process 710.

Concurrently, the present system 700 is able to examine the etching process on the grouping of patterned layers undergoing the etching process. The feedback system 700 includes a fluorescence detector 740 that measures the intensity of the fluorescence of the fluorescent markers in the grouping of patterned layers under test. The fluorescence detector 740 can be any appropriate imaging system (e.g., photodiode, fluorescence microscope, etc.). The fluorescent detector 740 produces a signal 745 that is compared to a desired reference signal 720 (e.g., a threshold signal) by the comparator 730. The desired reference signal 720 indicates the minimum acceptable amount of etching to be performed. In another embodiment, the signal 645 can be processed visually, and a determination can be made if less or more etching is desired.

Depending on the results of the comparator 730, a feedback signal 735 is returned to the etching process. For example, if the signal 745 is more intense than the desired reference signal 720, then more etching is desired. On the other hand, if the signal 745 is less intense than the desired reference signal 720, then less etching is desired.

Accordingly, various embodiments of the present invention disclose a method and system for etching of patterned layers. Embodiments of the present invention provide for the above accomplishments and provide for the controlled removal of various layers of imprint material and deposited device layers. In addition, other embodiments provide the above accomplishments and further provide for remote, real-time monitoring and measuring of layer thicknesses. Still other embodiments provide the above accomplishments and further provide for a method and structures facilitating precise etch control and layer thickness estimates using non-contact remote sensing optical methods.

While the methods of embodiments illustrated in flow chart 500 show specific sequences and quantity of operations, the present invention is suitable to alternative embodiments. For example, not all the operations provided for in the methods presented above are required for the present invention. Furthermore, additional operations can be added to the operations presented in the present embodiments. Likewise, the sequences of operations can be modified depending upon the application.

A method and structure for facilitating etching is thus described. While the invention has been illustrated and described by means of specific embodiments, it is to be understood that numerous changes and modifications may be made therein without departing from the spirit and scope of the invention as defined in the appended claims and equivalents thereof. Furthermore, while the present invention has been described in particular embodiments, it should be appreciated that the present invention should not be construed as limited by such embodiments, but rather construed according to the below claims.

What is claimed is:

1. A method for facilitating etching, comprising:
   incorporating a fluorescent marker in a layer of a grouping of patterned layers; and
   controlling etching of said grouping of patterned layers based upon said fluorescent marker.

2. The method of claim 1, wherein said controlling etching comprises:
   controlling etching based upon intensity of emitted energy of said fluorescent marker in said layer.

3. The method of claim 2, further comprising:
   adjusting etch rates of said layer based upon said emitted energy that is measured.

4. The method of claim 2, further comprising:
   comparing said emitted energy to a desired threshold; and
   increasing etching of said layer if said emitted energy is above said desired threshold.

5. The method of claim 2, further comprising:
   comparing said emitted energy to a desired threshold; and
   decreasing etching of said layer if said emitted energy is lower than said desired threshold.

6. The method of claim 1, wherein said controlling etching comprises:
   providing a substrate in said grouping of patterned layers;
   depositing a 3D resist structure over said substrate, wherein said 3D resist structure comprises said layer; and
   measuring an emitting energy of said fluorescent marker in said layer to determine a degree of etching of said layer.

7. The method of claim 1, wherein said controlling etching comprises:
   providing a substrate in said grouping of patterned layers;
   depositing a device layer of material over said substrate, wherein said device layer comprises said layer incorporating said fluorescent marker;
   depositing a 3D resist structure over said substrate; and
   measuring an emitting energy of said fluorescent marker in said layer to determine a degree of etching of said layer.

8. The method of claim 7, further comprising:
   incorporating a second fluorescent marker in said 3D resist structure;
   measuring an emitting energy of said second fluorescent marker in said 3D resist structure to determine a degree of etching of said 3D resist structure.

9. The method of claim 1, further comprising:
   utilizing a self-aligned imprint lithography (SAIL) process to form a plurality of semiconductor devices.

10. The method of claim 1, further comprising:
    illuminating said fluorescent marker in said layer at varying angles.

11. A structure facilitating etching, comprising:
    a substrate; and
    a 3D resist structure deposited over said substrate, wherein said 3D resist structure incorporates a first fluorescent marker for controlling etching of said 3D resist structure, wherein said first fluorescent marker is responsive to light energy at a first frequency.

12. The structure of claim 11, further comprising:
    a multi-level device layer sandwiched between said substrate and said 3D resist structure, wherein said multi-level device layer incorporates a second fluorescent marker for controlling etching of said multi-level device layer, wherein said second fluorescent marker is responsive to light energy at a second frequency.

13. The structure of claim 11, wherein said substrate comprises:
    a flexible substrate.

14. The structure of claim 11, wherein said fluorescent marker comprises a complex organic dye molecule.

15. The structure of claim 11, wherein said fluorescent marker is taken from a group consisting of:
    Rhodamin 6G;
    Alexa Fluor 488 dye;
    Fluorescein; and
    Oregon green.

16. A structure facilitating etching, comprising:
    a substrate; and
    a multi-level device layer of material deposited over said substrate, wherein said multi-level device layer incorporates a first fluorescent marker for controlling etching of said multi-level device layer, wherein said first fluorescent marker is responsive to light energy at a first frequency.

17. The structure of claim 16, further comprising:
    a 3D resist structure deposited over said device layer.

18. The structure of claim 17, wherein said 3D resist structure incorporates a second fluorescent marker for controlling etching of said 3D resist layer, wherein said second fluorescent marker is responsive to light energy at a second frequency.

19. The structure of claim 16, wherein said fluorescent marker is taken from a group consisting of:
    rare earth ions; and
    organometalic rare earth compounds.

20. The structure of claim 16, wherein said multi-level device layer comprises a MEMs structure.

* * * * *